United States Patent [19]

Blanding et al.

[11] Patent Number: 4,752,353

[45] Date of Patent: Jun. 21, 1988

[54] METHOD FOR TRANSFER PRINTING OF TV SHADOW MASK RESIST

[75] Inventors: Wendell S. Blanding, Painted Post, N.Y.; Ronald E. Johnson, Tioga, Pa.; Robert V. VanDewoestine, Corning, N.Y.

[73] Assignee: Corning Glass Works, Corning, N.Y.

[21] Appl. No.: 427,731

[22] Filed: Sep. 29, 1982

[51] Int. Cl.[4] .................... B44C 1/22; C03C 15/00; B44B 5/00; G03F 9/00

[52] U.S. Cl. .................... 156/660; 156/661.1; 156/240; 156/277; 430/5

[58] Field of Search .................... 156/659.1, 660, 230, 156/231, 232, 235, 238, 240, 249, 277, 539, 661.1, 660, 644, 634; 101/33, 34, 229, 230, 231, 35, 36, 37; 430/312, 318, 319, 23, 5, 7; 427/64, 68

[56] References Cited

U.S. PATENT DOCUMENTS

| | | | |
|---|---|---|---|
| 72,553 | 12/1867 | Skinner | 156/660 |
| 139,360 | 5/1873 | Bingham | 101/229 |
| 378,423 | 2/1888 | Baynes | 156/660 |
| 3,415,699 | 12/1968 | Brown | 156/660 |
| 3,679,500 | 7/1972 | Kubo et al. | 156/661.1 |
| 3,973,964 | 8/1976 | Lange | 430/5 |
| 3,975,198 | 8/1976 | Palac et al. | 430/5 |
| 4,058,432 | 11/1977 | Schuster-Woldan et al. | 156/661.1 |
| 4,155,801 | 5/1979 | Provancher | 156/660 |
| 4,208,242 | 6/1980 | Zampiello | 156/659.1 |
| 4,261,749 | 4/1981 | Johnson | 106/23 |
| 4,267,000 | 5/1981 | Dix et al. | 156/277 |
| 4,280,939 | 7/1981 | Johnson | 106/23 |
| 4,292,104 | 9/1981 | Heimbach et al. | 156/235 |
| 4,318,026 | 3/1982 | D'Amato | 156/634 |
| 4,440,589 | 4/1984 | Lock | 156/235 |
| 4,549,928 | 10/1985 | Blanding et al. | 156/660 |
| 4,557,798 | 12/1985 | Blanding et al. | 156/660 |

FOREIGN PATENT DOCUMENTS

| | | | |
|---|---|---|---|
| 2464 | of 1854 | United Kingdom | 156/660 |

OTHER PUBLICATIONS

Garwin IBM Technical Disclosure, vol. 25, No. 5, Oct. 1982, p. 2598.

*Primary Examiner*—Michael Ball
*Assistant Examiner*—Louis Falasco
*Attorney, Agent, or Firm*—Alfred L. Michaelsen

[57] ABSTRACT

An offset printing process is utilized for printing an acid resist ink onto both sides of a TV aperture mask. Printing is accomplished after the mask has been formed into an approximate spherical or cylindrical shape, and after a peripheral frame has been attached thereto. The resist ink employed is a pressure-sensitive hot-melt composition which forms an acid resistant film when deposited on the mask.

6 Claims, 2 Drawing Sheets

METHOD FOR TRANSFER PRINTING OF TV SHADOW MASK RESIST

BACKGROUND OF THE INVENTION

In a conventional color TV bulb, the shadow mask is formed from 0.006" thick low carbon steel sheet. Flat stock is blanked out in a stamping operation. A photosensitive resist is applied to both sides of the flat sheet and the resist is exposed to light through a negative photo-mask. The exposed portion of the resist reacts to light in a known manner (i.e. as a positive) to allow etching of holes or slots from both sides of the sheet. The resist patterns applied on each side are identical in spacing, but may differ in size. Often the holes on one side of the mask are slightly larger. After acid etching, the flat sheet is formed by a stamping operation into a specific cylindrical or spherical shape for the panel. A frame is attached to the mask and the structure is annealed. The forming operation introduces enough deformation into the hole pattern to cause each mask to be unique.

SUMMARY OF THE INVENTION

A negative ink pattern is printed on both sides of a preformed shadow mask. The ink is formed of an acid resistant hot-melt composition. Portions of the mask, covered by the ink, resist the acid and remain intact; other portions of the mask, exposed to the acid, dissolve, thereby producing an aperture array in the mask.

DESCRIPTION OF THE PREFERRED EMBODIMENT

In the present invention, a coating of resist ink is printed in a selected pattern on both sides of a shadow mask blank after it has been formed into the desired shape. The mask may thereafter be etched to form apertures thereon. Because there are no forming operations after etching; the mask is not subjected to significant deformation after the apertures are in place. Thus, the possibility exists that masks can be constructed which are interchangeable with various panels of similar manufacture.

If interchangeable masks are available, it becomes more practical to print a target formed of a black matrix and color phosphors onto the inside of a TV panel. Preferably, the target is printed onto the panel as described in copending U.S. patent applications Ser. No. 427,514 now U.S. Pat. No. 4,557,798 and Ser. No. 427,515 now U.S. Pat. No. 4,549,928 filed this same date. The result is a far less complex TV bulb manufacturing process than is currently employed.

Resist inks utilized in the present invention are preferably pressure-sensitive, hot-melt materials. Some of these inks exhibit sufficient adhesion and acid resistance to serve as satisfactory acid resists in their cooled ambient state. Some inks are thermoplastic, that is, they reversably soften with temperature. Some inks are thermosetting and use latent catalysts, which are selected to induce crosslinking or cure at temperatures about 300° F. Some may simply use cross-linking agents with low rates of reactivity at printing temperatures. Once curing or cross-linking occurs, the inks may be referred to as thermoset materials. Waxes may also be employed as suitable resist inks, but are generally not preferred due to their need for precise temperature control of the offset surface and mask during printing to effect satisfactory transfer.

Figure 1:
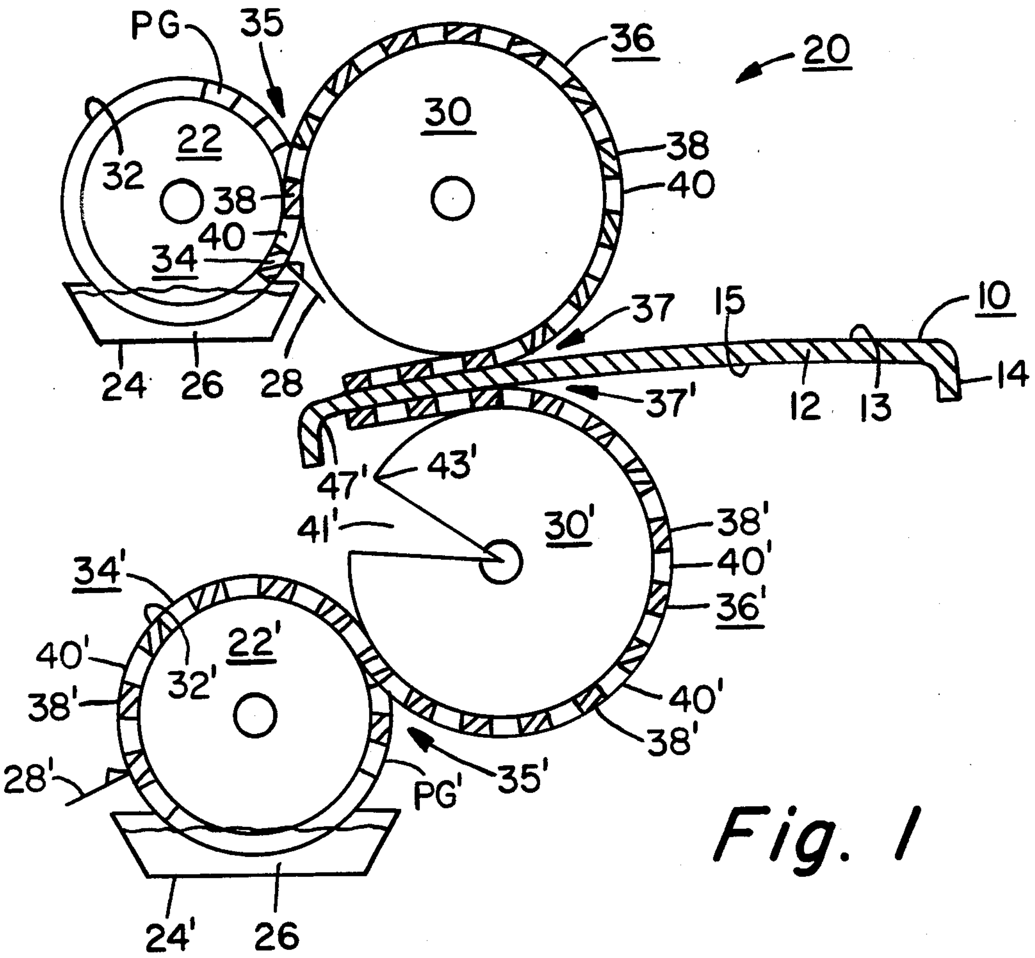
FIG. 1 is a fragmented schematic representation, in side section, of a printing apparatus and a preformed and framed shadow mask having its front and back sides printed.

In FIG. 1, there is illustrated a fragmented side view of an aperture mask 10 including a preformed curvilinear cylindrical or spherical shadow mask portion 12 and a perepherially attached frame 14. The frame 14 may be an integrally formed bead, as shown, or a separately welded ring. The mask portion 12 has respective front and back sides 13 and 15, each of which receives a printed coating as hereafter described.

Printing is preferably accomplished by means of an offset gravure apparatus. In gravure printing, a surface portion of a heated gravure roll or inking surface is etched or engraved with a pattern. The gravure roll receives a supply of molten ink, which is doctored in a conventional manner. Molten ink remains in the engravings after doctoring. The gravure roll is contacted with a transfer roll, which receives a portion of the ink in the engravings by a splitting action. The transfer roll carries the ink in a pattern corresponding to the engravings in the gravure roll. Transfer of the pattern from the transfer roll to an object to be printed occurs by intimate contact of the transfer roll and object.

In the present invention an offset gravure printing apparatus 20 is disclosed for printing the respective front and back sides 13 and 15 of the mask 10. The printing apparatus 20 requires similar elements for printing the respective front and back sides 13 and 15 of the mask 10. Such similar elements, hereinafter described, will be referred to by the same descriptive name, but with the reference numerals for the elements used to print the back side 15 of mask 10 being primed counterparts of the reference numerals for the elements used for printing the front side 13.

The printing apparatus 20 includes: heated inking surfaces or gravure rolls 22—22', heated troughs 24—24', doctor blades 28—28' and silicone elastomeric offset transfer rolls 30—30'. Melted thermoplastic ink 26 is carried in troughs 24—24'. A surface 32—32' of each gravure roll 22—22' is etched or engraved with a respective pattern PG—PG'. The melted ink 26 is deposited on each transfer roll 22—22' and any excess is removed by corresponding doctor blades 28—28' in a known manner. The ink 26 remaining on each roll 22—22' forms a molten film 34—34' in a pattern corresponding to the etchings PG—PG' in the respective gravure roll 22—22'.

Although exaggerated in thickness and the dimensions, each film 34—34' has respective solid portions 38—38' and aperture portions 40—40'. Each respective offset roll 30—30' contacts the corresponding gravure roll 22—22', as shown, and picks up the film 34—34' by splitting action (see reference numerals 35—35'). Each offset roll 30—30' is cool with respect to gravure rolls 22—22'. Preferably, offset rolls 30—30' are unheated and operable at or near room temperature (80°-150° F.). The film 34—34', carried by each respective gravure roll 22—22', freezes upon contact with the offset roll 30—30' and forms respective cohesive films 36—36' thereon.

The ink 26, forming cohesive films 36—36' on offset rolls 30—30', is tacky at the temperature at which said rolls operate. Each cohesive film 36—36' transfers completely from the corresponding offset roll 30—30' to respective front and back sides 13 and 15 of aperture mask 10 upon intimate contact (see reference numerals 37—37'). The offset rolls 30—30' act as mutual backing members as mask 10 is passed therebetween during the printing operation.

The offset roll 30' used for printing the back side 15 of mask 10 has a cut 41' formed therein to allow the offset roll 30' to clear the frame 14. The offset roll 30' is oriented so that leading edge 43' of the cut 41' first engages the back side 15 of mask 10 near where the frame 14 and mask portion 12 meet at inside corner 47'.

In another preferred embodiment, plain inking rolls may be substituted for gravure rolls 22—22', and raised patterned flexographic rolls may be substituted for offset rolls 30—30'.

Figure 2:
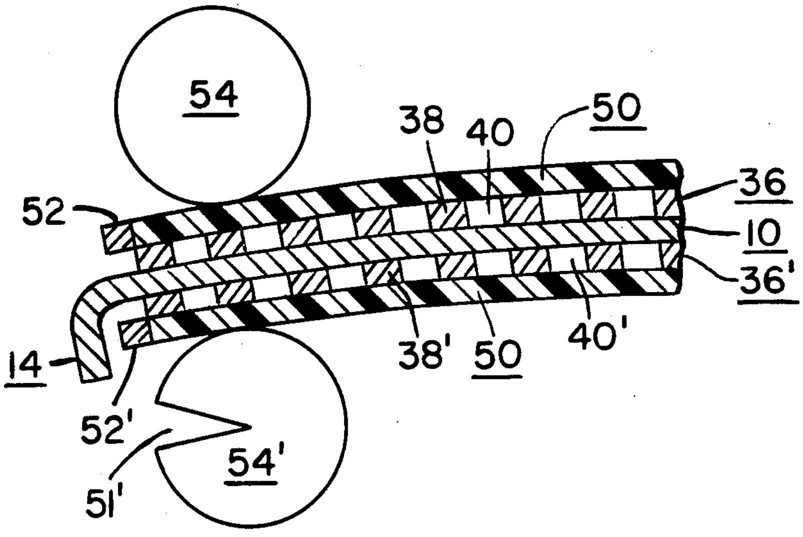
FIG. 2 is a fragmented schematic representation of an alternate method and apparatus for printing both sides of a shadow mask.

In FIG. 2, the aperture mask 10 may be printed using collectors 50—50' formed of flexible membranes or fiberglass reinforced silicone blankets. Respective cohesive films 36—36' may first be deposited into collectors 50—50' by a gravure process. The cohesive films 36—36' have a greater affinity for the mask 10 than respective collectors 50—50'. Thus, each cohesive film 36—36' may be deposited on the respective front and back sides 13 and 15 of mask 20 by urging the collectors 50—50' and the respective cohesive films 36—36' into intimate contact with the mask 10 as shown. Opposed rolls 54—54' urge the respective collectors 50—50' against the mask 10. The rolls 54—54' act as complimentary backing members for each other. The roll 54' may have a cut 51' for allowing it to clear frame 14.

Figure 3:
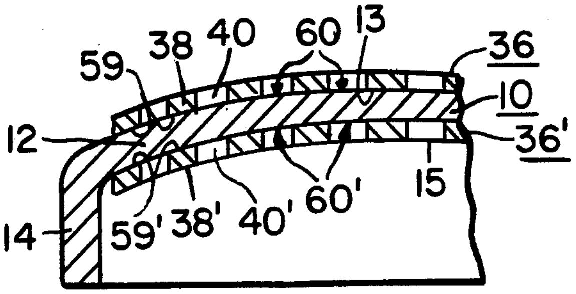
FIG. 3 is a schematic representation of the shadow mask, printed in accordance with either of FIGS. 1 or 2, before etching.
Figure 4:
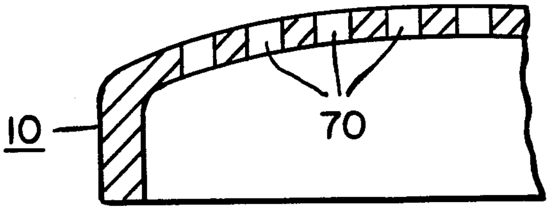
FIG. 4 is a schematic representation of the shadow mask of FIG. 3 after etching.

In FIG. 3 the cohesive films 36—36' are shown printed onto the respective opposite sides 13 and 15 of the mask 10 with their respective solid portions 38—38' and aperture portions 40—40' in alignment or registration. The cohesive films 36—36' are printed onto the mask portion 12 and form coated portions 59—59' and uncoated or exposed portions 60—60' thereon in alignment or registration as shown. The exposed portions 60—60' are subjected to acid etching whereby through holes or apertures 70 may be made in the aperture mask 10 (see FIG. 4).

Figure 5:
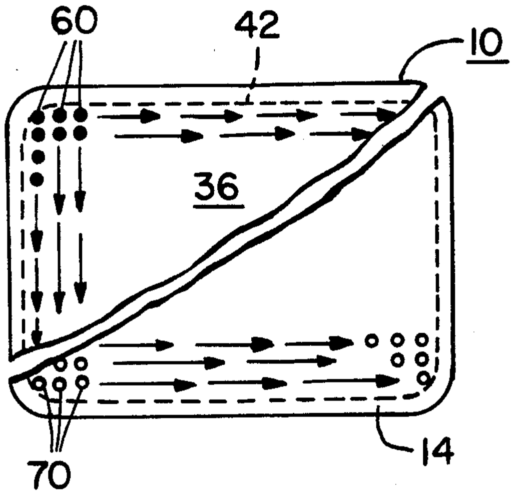
FIG. 5 is a front view of the shadow mask of FIG. 4.

In FIG. 5 the aperture mask 10 is shown in two fragmented parts of a front elevation. In the upper part of the drawing, prior to acid etching, the cohesive film 36 is shown deposited onto the front side 13 of the aperture mask 10 with exposed portions 60 of the same shown as darkened circles. In the lower portion of the drawing, after acid etching, the exposed portions 60 of the aperture mask 10 have been dissolved, forming the holes or apertures 70 therein, shown as open circles. It should be understood that the etching takes place from both sides of the aperture mask 10. Once etching is complete, the aperture mask 10 is thoroughly cleaned and rinsed for removing acid and ink therefrom (see FIG. 4). The interchangeable aperture mask 10 of the present invention is thus completed.

A preferred ink 24 is disclosed in the following example.

| Material | Parts/Weight |
|---|---|
| Epon 1001 (Shell) | 60 |
| FC 431 (3M) | 1 |
| Z6040 (Dow-Corning) | 2 |
| Dicyandiamide | 1 |
| Dibutylphthalate | 25 |
| K745 Black (Ferro) | 25 |
| Print at between 125-175° F. | |
| Cure for ½ hr. at 300-500° F. | |

In the example, the ink 26 acts as a heat-processable, thermoplastic pressure-sensitive material. The ink 26 reversably melts with heat and solidifies upon cooling, however, it may be formulated to become thermosetting at higher temperatures as for the example ink 24. The ink become tacky as it cools so that a pressure sensitive cohesive film may be produced. The ink 26 is formulated to preferentially stick to one surface over another. Thus, in the present invention, the ink 26 preferentially sticks to the mask 10 and releases from the offset rolls 30—30'. Similarly if intermediate surface carriers are used, for example, collectors 50—50', the ink 26 and the surfaces against which it preferentially adheres are formulated to provide a preferred order of adherence.

If a thermosetting ink 26 is used, the mask 10 should be heated after it is printed to cure. Preferably, a thermosetting ink is formulated to cure or cross-link above 300 F.

Further processes and materials suitable for resist printing are disclosed in U.S. Pat. Nos. 4,267,000, 4,261,749, 4,292,104 and 4,280,939 and U.S. patent application Ser. No. 173,129 filed July 28, 1980 now U.S. Pat. No. 4,445,432.

Unless otherwise stated, the patents and applications for patents referred to above are assigned to the assignee of the present invention and incorporated by reference herein.

We claim:

1. A process for making a TV aperture mask comprising the steps of:
 - providing a metal sheet;
 - first forming said sheet into a desired shape having a curvilinear shadow mask portion with opposite complimentary front and back sides;
 - then simultaneously registerably printing an acid resistant ink on said front and back sides of said curvilinear shadow mask portion of the metal sheet by depositing a pattern of ink on a transfer surface and then transferring the ink on to the metal sheet;
 - selectively covering said curvilinear shadow mask portion with said acid resistant ink in a desired aperture pattern registerably aligned on said opposite front and back sides of said curvilinear mask portion;
 - acid etching said mask in portions of said metal sheet not covered by said acid resistant ink;
 - and producing apertures in a desired pattern through said metal sheet to form a TV aperture mask.

2. A process as described in claim 1 further comprising the step of: formulating an ink from a heat processable, thermoplastic composition.

3. A process as described in claim 2 wherein the printing step further comprises the steps of: intimately contacting the transfer surface with the side of the mask portion corresponding thereto; preferentially adhering said ink to said mask; and releasing said ink from the transfer surface during such intimate contact.

4. A process as described in claim 2 wherein the printing step comprises the steps of: melting the ink; depositing the melted ink into a heated inking surface and maintaining the ink melted thereon; transferring the ink to a relatively cool offset surface; causing the ink to form a cohesive film thereon; and totally transferring the ink onto the metal sheet by intimately contacting the offset surface and shadow mask portion.

5. A process as described in claim 4 wherein the printing step comprises the steps of: establishing the pattern in at least one of the inking surface and offset surface.

6. A process as described in claim 1 further comprising the step of: formulating the ink with a thermosetting composition, and heating the ink after deposition onto the mask to above a curing temperature of the ink for setting the same on the mask portion.

* * * * *